United States Patent
Kawaguchi

(10) Patent No.: US 7,859,583 B2
(45) Date of Patent: Dec. 28, 2010

(54) SOLID-STATE IMAGE CAPTURE DEVICE, ANALOG/DIGITAL CONVERSION METHOD FOR SOLID STATE IMAGE CAPTURE DEVICE, AND IMAGE CAPTURE DEVICE

(75) Inventor: Shunji Kawaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 337 days.

(21) Appl. No.: 12/182,339

(22) Filed: Jul. 30, 2008

(65) Prior Publication Data
US 2009/0040352 A1    Feb. 12, 2009

(30) Foreign Application Priority Data
Aug. 6, 2007  (JP) .............................. 2007-203786

(51) Int. Cl.
*H04N 5/335* (2006.01)
(52) U.S. Cl. ...................... 348/308; 348/294
(58) Field of Classification Search .................. 348/294, 348/308, 222.1
See application file for complete search history.

(56) References Cited

U.S. PATENT DOCUMENTS

2008/0211951 A1 *  9/2008  Wakabayashi et al. ...... 348/308
2009/0316015 A1 * 12/2009  Iwasa et al. ............... 348/222.1

FOREIGN PATENT DOCUMENTS

| JP | 2004-260517 | 9/2004 |
|----|-------------|--------|
| JP | 2005-303648 | 10/2005 |
| JP | 2007-019682 | 1/2007 |

OTHER PUBLICATIONS

Japanese Office Action issued on Jun. 16, 2009 in connection with JP Application No. 2007-203786.

* cited by examiner

*Primary Examiner*—Tuan Ho
(74) *Attorney, Agent, or Firm*—SNR Denton US LLP

(57) ABSTRACT

A solid state image capture device includes a pixel array unit having unit pixels including a photoelectric conversion element disposed in a matrix shape and analog/digital conversion means for converting an analog pixel signal read from the unit pixel of the pixel array unit into digital data. The analog/digital conversion means includes a comparator unit for converting a magnitude of the pixel signal into information in a time axis direction, a counter unit for performing a count process during a time period from a start time of a comparison process at the comparator unit to an end time of the comparison process, a multi-phase clock generate unit for generating multi-phase clocks having a constant phase difference, a latch unit for latching logic states of the multi-phase clocks, and a decode unit for decoding latch data of the latch unit to obtain a value lower than a count value.

7 Claims, 6 Drawing Sheets

DECODE CONTENTS

| INPUT (LATCH3,LATCH2,LATCH1,LATCH0) | OUTPUT |
|---|---|
| 0001 | 00 |
| 0011 | 01 |
| 0111 | 10 |
| 1111 | 11 |
| 1110 | 00 |
| 1100 | 01 |
| 1000 | 10 |
| 0000 | 11 |

… # SOLID-STATE IMAGE CAPTURE DEVICE, ANALOG/DIGITAL CONVERSION METHOD FOR SOLID STATE IMAGE CAPTURE DEVICE, AND IMAGE CAPTURE DEVICE

BACKGROUND OF THE INVENTION

1. Field of the Invention

The present invention relates to a solid state image capture device, an analog/digital conversion method for the solid state image capture device, and an image capture device.

2. Description of Related Art

As one scheme for a solid state image capture device, techniques called column AD conversion scheme are known. According to the techniques of the column AD conversion scheme, in an amplification type solid state image capture device which is a type of a X-Y address type solid state image capture device, e.g., an MOS (including CMOS) type solid state image capture device, an analog/digital (AD) converter is disposed, for example, per each pixel column, i.e., column parallel, with respect to a pixel array unit having pixels each including a photoelectric conversion element disposed two-dimensionally in a matrix shape, and an analog pixel signal read from each pixel of the pixel array unit is converted into digital data and outputted.

In AD converters disposed column parallel, a comparator compares each analog pixel signal read from each pixel of the pixel array unit on the row unit basis via a column signal line with a reference signal of a ramp waveform to generate a pulse signal corresponding to each magnitude of reference components and signal components and having a magnitude (pulse width) in a time axis direction. A counter unit counts a predetermined clock during a period of the pulse width of the pulse signal, and the count value of the counter unit is converted into digital data corresponding to the amplitude of the pixel signal to thus perform an AD conversion operation.

In order to realize high speed AD conversion in a solid state image capture device of the column AD conversion scheme, a clock conversion unit for generating a clock faster than a master clock is provided, and a high speed clock generated by the clock conversion unit is used as a count clock of the counter unit, whereby a processing speed of an AD conversion process is not limited by the speed (frequency) of the master clock (e.g., refer to Japanese Unexamined Patent Application Publication No. 2005-303648, Patent Document 1).

More specifically, the counter unit counts the pulse width of the pulse signal until a comparison end of the comparator at high speed clock, and holds the count value at the comparison completion time. While at a first count process, down count is performed for the reference components (reset components) read from a pixel, at a second count process, up count is performed for the signal components read from the pixel.

By performing the count process twice, the count value held after the second count process becomes a difference between the count values of the first count process. In other words, two count processes in which the count mode is changed are executed when the count process is executed based on high speed clocks, and whereby a digital value corresponding to a difference between the reference components and signal components can be obtained as the count value of the second count process.

SUMMARY OF THE INVENTION

As described above, according to the related art techniques (Patent Document 1) of converting difference signal components between the reference components and signal components into digital data by performing the count process twice, higher speed clocks are required in order to operate a total AD conversion process at high speed and shorten the AD conversion time (time required for AD conversion). The AD conversion time comes to be limited by an operation speed of the counter unit.

Accordingly, it is desirable to provide a solid state image capture device, an AD conversion method for the solid state image capture device and an image capture device capable of realizing faster AD conversion without being limited by an operation speed of a counter unit.

According to embodiments of the present invention, there is provided a solid state image capture device having a pixel array unit in which unit pixels each including a photoelectric conversion element are disposed in a matrix shape. When an analog pixel signal read from the unit pixel is converted into digital data, magnitude of the pixel signal is converted into information in a time axis direction by comparing a reference signal for converting to the digital data and the analog pixel signal, and in parallel to the comparison process, a count process is executed at a counter unit during a time period from a start time to an end time of the comparison process, in accordance with a predetermined clock. On the other hands, multi-phase clocks having a constant phase difference are generated in accordance with the predetermined clock, and logic states of the multi-phase clocks are latched when the comparison process is completed. The latch data is decoded and arranged to be a value lower than a count value by the count process.

In the AD conversion process of converting an analog pixel signal read from the unit pixel into digital data, because information in the time axis direction being a comparison output between the reference signal and pixel signal corresponds to magnitude of the pixel signal, by making the counter unit execute a count process during a period from a start time to end time of the comparison process (information in the time axis direction), magnitude of the pixel signal can be obtained as the count value (digital value). By latching the logic states of the multi-phase clocks when the comparison process ends, a bit string having time information smaller than the lowest bit of the count value in the counter unit may be obtained. This bit string is subject to decode process, and the decode data is added to the count value by the count process as a value lower than the count value.

According to embodiments of the present invention, the logic states of the multi-phase clocks are latched and decoded when the comparison process between the reference signal and pixel signal ends, in order to add as a value lower than the count value of the counter unit. Accordingly, the bit width of the counter unit can be narrowed when AD conversion for the same bit width is performed, whereby AD conversion faster than correspondence obtained by narrowing the bit width of the counter unit becomes possible without being limited by the operation speed of the counter unit. If AD conversion is performed in the same AD conversion time, the bit width of AD conversion may be increased.

DETAILED DESCRIPTION OF THE EMBODIMENTS

Embodiments of the present invention will be described below in detail with reference to the drawings.

[Structure of CMOS Image Sensor]

Figure 1:
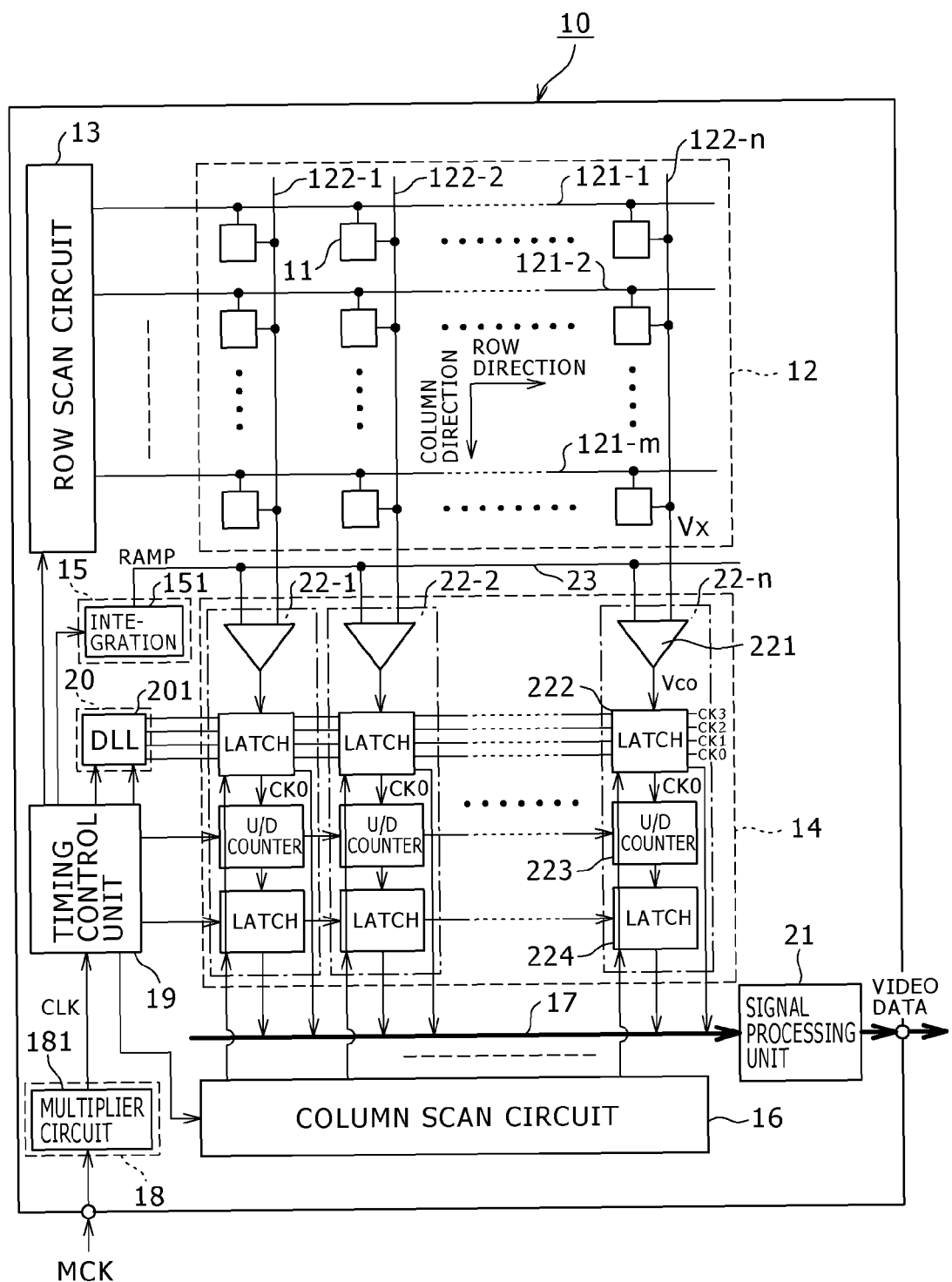
FIG. 1 is a system configuration diagram showing the outline structure of a column AD conversion type CMOS image sensor according to an embodiment of the present invention.

FIG. 1 is a system configuration diagram showing the outline structure of a solid state image capture apparatus, e.g., a column (column parallel) AD conversion type CMOS image sensor according to an embodiment of the present invention.

As shown in FIG. 1, a CMOS image sensor 10 according to the present embodiment has a system configuration having a pixel array unit 12 in which unit pixels 11 having photoelectric conversion elements are arranged two-dimensionally in a matrix shape, and its peripheral circuits. The peripheral circuits include a row scan circuit 13, a column processing unit 14, a reference signal generate unit 15, a column scan circuit 16, a horizontal output line 17, a clock conversion unit 18, a timing control unit 19, a multi-phase clock generate unit 20, a signal processing unit 21 and the like.

In this system configuration, the peripheral drive system and a signal processing system for driving and controlling each unit pixel 11 of the pixel array unit 12, i.e., peripheral circuits, such as the row scan circuit 13, column processing unit 14, reference signal generate unit 15, column scan circuit 16, horizontal output line 17, clock conversion unit 18, timing control unit 19, multi-phase clock generate unit 20, signal processing unit 21 and the like, are integrally formed together with the pixel array unit 12 in a semiconductor region such as single crystal silicon, by using techniques similar to that of semiconductor integrated circuit manufacture techniques.

An auto gain control (AGC) circuit having a signal amplification function and the like may be provided in the same semiconductor region identical with that of the column processing unit 14 where necessary, at the preceding or subsequent stage of the column processing unit 14. If AGC is performed at the preceding stage of the column processing unit 14, analog amplification is performed, whereas if AGC is performed at the subsequent stage of the column processing unit 14, digital amplification is performed. However, if N-bit digital data is amplified in a simple manner, there is a possibility that tone is degraded. It is therefore considered that it is rather preferable to perform digital conversion after data is amplified at analog.

Although not shown, the unit pixel 11 is typically constituted of a photoelectric conversion element (e.g., photodiode) and an intra-pixel amplifier having an amplification semiconductor element (e.g., transistor). For example, a floating diffusion amplifier structure is used as the intra-pixel amplifier.

As one example, a structure constituted of four transistors: a transfer transistor as an example of a charge read unit (transfer gate unit); a reset transistor as an example of a reset gate unit; a select transistor; and an amplifier transistor of, e.g., a source follower structure may be used with respect to photoelectric conversion element.

In the intra-pixel amplifier, the read transistor reads electric charges photo-electrically converted at the photoelectric conversion element to a floating diffusion. The reset transistor resets a potential of the floating diffusion to a predetermined potential. The select transistor selects the unit pixel 11 in synchronization with scanning by the row scan circuit 13. The amplifier transistor detects a potential change of the floating diffusion.

The unit pixel 11 is not limited to the above-described 4-transistor structure, but other pixel structures may also be used, such as a 3-transistor structure reducing one transistor by making the amplifier transistor have the pixel select function of the select transistor.

In the pixel array unit 12, unit pixels 11 are two-dimensionally disposed in m rows and n columns. With respect to the pixel array of m rows and n columns, row control lines 121 (121-1 to 121-$m$) are wired for respective rows, and column signal lines 122 (122-1 to 122-$n$) are wired for respective columns.

One ends of the row control lines 121-1 to 121-$m$ are connected to respective output terminals corresponding to respective rows of the row scan circuit 13.

The row scan circuit 13 is constituted of a shift register, a decoder or the like, and controls row addresses and row scan of the pixel array unit 12 via the row control lines 121-1 to 121-$m$ when driving each unit pixel 11 of the pixel array unit 12.

The column processing unit 14 has analog/digital conversion units (hereinafter referred to as column ADC units) 22-1 to 22-$n$ provided for respective pixel columns of the pixel array unit 12, i.e., for respective column signal lines 122-1 to 122-$n$, and analog pixel signals read from respective unit pixels 11 of the pixel array unit 12 via the column signal lines 122-1 to 122-$n$ per respective pixel columns are converted into digital data to be outputted.

In this example, there is adopted a structure in which the column ADC units 22 (22-1 to 22-$n$) are disposed in one-to-one correspondence relation with the pixel columns of the pixel array unit 12. This structure is however only an example, and not limited to this layout. For example, it is possible to adopt a structure in which one column ADC unit 22 is disposed for a plurality of pixel columns and the one column ADC unit 22 is used time divisionally among the plurality of pixel columns.

The column processing unit 14 constitutes analog/digital conversion means for converting analog pixel signals read from respective unit pixels 12 of a selected pixel row of the pixel array unit 11 into digital pixel data, together with the reference signal generate unit 15, multi-phase clock generate unit 20, and a decode unit 210 of the signal processing unit 21

(described later). The details of the column processing unit 14, particularly the column ADC units 22 (22-1 to 22-n), will be described later.

The reference signal generate unit 15 is constituted of, e.g., an integrator 151, and generates a reference voltage RAMP of a so-called ramp waveform whose level changes in a slope shape (in this example, a lowering slope) according to a lapse of time, under control of the timing control unit 19, for supplying the reference voltage RAMP to the column ADC units 22-1 to 22-n of the column processing unit 14 via a reference signal line 23.

Means for generating the reference voltage RAMP of a ramp waveform is not limited to the structure using the integrator 151, but the reference voltage RAMP of a ramp waveform may be generated by using a digital/analog converter (DAC) instead of the integrator 151.

However, if the structure is adopted in which the reference voltage RAMP of a ramp waveform is generated in an analog manner by using the integrator 151, a smooth reference voltage RAMP may be obtained. On the other hand, if the structure is adopted in which the reference voltage RAMP of a ramp waveform is generated in a digital manner by using DAC, the reference voltage RAMP has a stepwise ramp waveform. If the reference voltage RAMP, particularly with a high resolution is obtained, it is necessary to make fine each step of the stepwise ramp waveform, and accordingly, there arises a disadvantage that the circuit scale becomes large.

The column scan circuit 16 is constituted of a shift register, a decoder or the like, and controls column addresses and column scan of the column ADC units 22-1 to 22-n of the column processing unit 14. Under control of the column scan circuit 16, digital data which is A/D converted at the column ADC units 22-1 to 22-n respectively is sequentially read to the horizontal output line 17.

The clock conversion unit 18 is constituted of, e.g., a multiplier circuit 181, receives an externally inputted master clock MCK, converts the master clock into a high speed clock CLK having frequency higher than frequency of master clock MCK two times or more, and supplies the high speed clock CLK to the timing control unit 19.

In accordance with the high speed clock CLK supplied from the clock conversion unit 18, the timing control unit 19 generates internal clocks, control signals and the like which are used as the standards for the operations of the row scan circuit 13, column processing unit 14, reference signal generate unit 15, column scan circuit 16, multi-phase clock generate unit 20 and the like, and supplies the internal clocks, control signals and the like to the row scan circuit 13, column processing unit 14, reference signal generate unit 15, column scan circuit 16, multi-phase clock generate unit 20, signal processing unit 21 and the like.

In this manner, the internal clocks, control signals and the like are generated based on the high speed clock CLK generated by the clock converter unit 18, and by performing circuit operations by using the internal clocks, various signal processing, such as AD conversion processing for converting analog pixel signals into digital data and output processing for outputting video data externally can be performed at a faster speed than a case which is based on the master clock MCK.

The multi-phase clock generate unit 20 is constituted of, e.g., a delay lock loop (DLL) 201, and outputs multi-phase clocks, e.g., four-phase clocks CK0, CK1, CK2 and CK3, by giving a constant phase difference (delay) to the high speed clock generated at the clock conversion unit (multiplier circuit) 18 and supplied via the timing control circuit 19. A specific structure of the delay lock loop 201 will be described later.

Under control of the column scan circuit 16, the signal processing unit 21 receives digital data read from the column ADC units 22-1 to 22-n of the column processing unit 14 via the horizontal output line 17, and performs signal processing such as decoding (described later) to the digital data and outputs as video data.

(Column ADC Unit)

Next, description will be made on the structure of the column ADC units (analog/digital conversion units) 22-1 to 22-n.

Each of the column ADC units 22-1 to 22-n compares an analog pixel signal read from each unit pixel 11 of the pixel array unit 12 via the column signal lines 122-1 to 122-n, with a reference signal supplied from the reference signal generate unit 15 for conversion into digital data, and generates a pulse signal having a magnitude (pulse width) in a time axis direction corresponding to each magnitude of reference components and signal components. Predetermined clocks are counted during the time period of the pulse width (information on a time axis direction) of the pulse signal, and A/D conversion is performed by assuming the count value as digital data corresponding to the magnitude of the pixel signal.

The details of the structure of the column ADC units 22-1 to 22-n will be described specifically with reference to FIG. 1. All the column ADC units 22-1 to 22-n have the same structure, and hereunder description is made by citing the column ADC 22-n as example.

The column ADC 22-n is configured to include a voltage comparing unit (comparator) 221, a first latch unit 222, a counter as an example of a counting means, e.g., an up/down counter (indicated in FIG. 1 as U/D counter) 223, and a second latch unit 224.

The voltage comparing unit 221 as an example of a comparing unit compares signal voltage Vx corresponding to an analog pixel signal outputted from the unit pixel 11 in the n-th column of the pixel array unit 12 via the column signal line 122-n, with the reference voltage RAMP of a ramp waveform supplied from the reference signal generate unit 15, to convert the magnitude of the pixel signal into information in the time axis direction (pulse width of the pulse signal). A comparison output Vco of the voltage comparing unit 221 becomes, for example, a high level when the reference voltage RAMP is larger than the signal voltage Vx, and becomes a low level when the reference voltage RAMP is not higher than the signal voltage Vx.

The first latch unit 222 receives the comparison output Vco of the voltage comparing unit 221, and at the timing when the comparison output Vco inverts, latches (holds/stores) the logic states of the four-phase clocks (CK0, CK1, CK2 and CK3) generated by the multi-phase clock generator unit 20 i.e., whether a logic is "1" (high level) or "0" (low level).

The up/down counter 223 as an example of a counter unit performs an up/down count operation by assuming for example, the clock CK0 (high speed clock CLK) supplied via the first latch unit 222, out of the four-phase clocks CK0, CK1, C2 and CK3, as a count clock, and whereby measures a comparison time period (=count value×count clock time cycle) from a start time of comparison process to end time of comparison process at the voltage comparing unit 221.

Specifically, at an operation of reading a signal from one unit pixel 11, the up/down counter 223 measures a comparison time of a first read operation by performing down count at first read operation and a comparison time of a second read operation by performing up count at second read operation, under control by a control signal supplied from the timing control unit 19.

Although the up/down counter 223 performs down count during the first read operation and performs up count during the second read operation, a structure in which up count is performed at the first read operation and down count is performed at the second read operation may be adopted. The details of the first and second read operations will be described later.

Under control of the timing control unit 19, the second latch unit 224 latches the final count value of the up/down counter 223. A counter having a latch function may be used as the up/down counter 223. In this case, the second latch unit 224 is not necessary.

Each latch data of the first and second latch units 222 and 224 is sequentially read to the horizontal output line 17 as digital pixel data corresponding to the analog pixel signal of the unit pixel 11, under control of column scan by the column scan circuit 16, and transferred to the signal processing unit 21 by the horizontal output line 17.

Latch data of the first latch unit 222 is 4-bit data corresponding to the four-phase clocks CK0 to CK3. Latch data of the second latch unit 224 is, for example, 10-bit data. The 10-bit data is just an example, and data having bits smaller than 10 bits (e.g., 8 bits) or data having bits larger than 10 bits (e.g., 14 bits) are allowable.

(Multi-Phase Clock Generate Unit)

Figure 2:
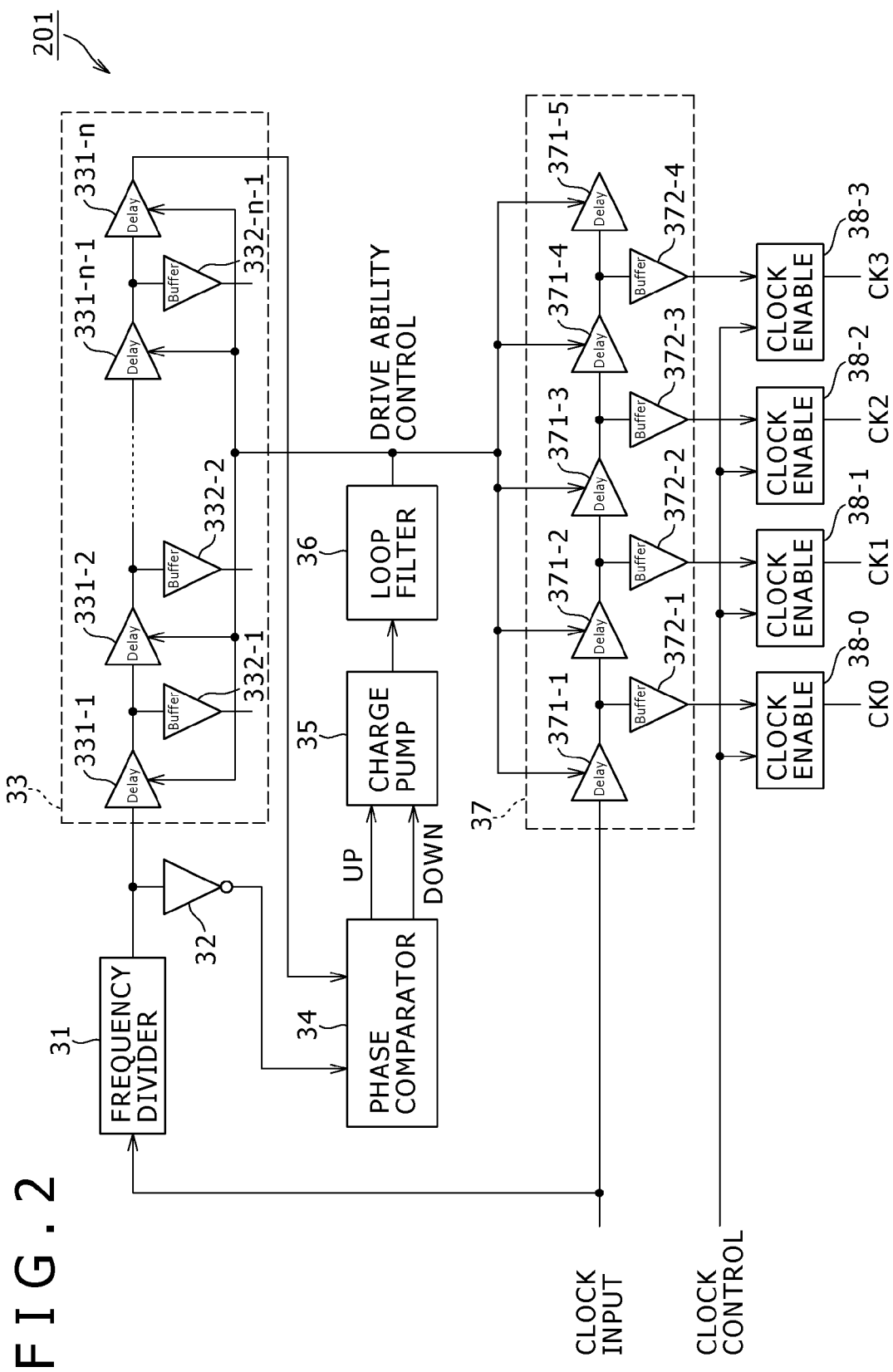
FIG. 2 is a block diagram showing an example of the structure of a delay control circuit constituting a multi-phase clock generator unit.

Next, with reference to FIG. 2, description will be made on the specific structure of the delay lock loop 201 constituting the multi-phase clock generate unit 20. FIG. 2 is a block diagram showing an example of the structure of the delay lock loop 201.

The delay lock loop (DLL) 201 of this example is constituted of a frequency divider circuit 31, an inverter 32, a (master) delay circuit 33, a phase comparator 34, a charge pump 35, a loop filter 36, a (slave) delay circuit 37 and clock enable circuits 38-0 to 38-3.

The (master) delayer circuit 33 is constituted of n-stage cascade connected delay circuits 331-1 to 331-$n$ and (n−1) buffers 332-1 to 332-$n$−1 connected to each output terminals of the delay circuits 331-1 to 331-$n$−1.

The number stages of the delay circuits 331-1 to 331-$n$, n, is determined by a frequency division ratio of the frequency division circuit 31. Specifically, it is determined as follows: the number of stages is 4 when a frequency division ratio of the frequency division circuit 31 is 2, the number of stages is 8 when a frequency division ratio is 4, the number of stages is 16 when a frequency division ratio is 6, the number of stages is 32 when a frequency division ratio is 16, and the like.

However, the number of stages of the delay circuits 331-1 to 331-$n$, n, is determined by the number of phases of the multi-phase clock. More specifically, the number n of stages of the delay circuits 331-1 to 331-$n$ is determined by the following formula:

$n$=(the number of phases of the multi-phase clock)×(frequency division ratio)/2

The (slave) delay circuit 37 is constituted of five cascade connected delay circuits 371-1 to 371-5 and four buffers 372-1 to 372-4 connected to each output terminals of the delay circuits 371-1 to 371-4.

In the delay lock loop 201 constructed as above, the frequency division circuit 31 frequency-divides an inputted clock, a delay clock delayed at the (master) delay circuit 33 is compared with an inverted clock obtained by inverting an output of the frequency division circuit 31 at the inverter 32 at the phase comparator 34, and drive ability control is performed via the charge pump 35 and loop filter 36 such that the phases coincide. In this manner, a delay amount of the (master) delay circuit 33 is controlled.

With the drive ability control, a delay amount of the (slave) delay circuit 37 is also controlled. Since one stage of the delay circuit 371 (371-1 to 371-5) of the (slave) delay circuit 37 is a copy of one stage of the delay circuit 331 (331-1 to 331-5) of the (master) delay circuit 33, a delay of one stage of the (slave) delay circuit 37 is coincident with a delay of one stage of the (master) delay circuit 33.

Clocks given a constant phase difference (delay) by the (slave) delay circuit 37 are outputted/stopped at the clock enable circuits 38-0 to 38-3 in accordance with a clock control signal inputted from the timing control unit 19 (refer to FIG. 1) to the delay lock loop 201, and outputted as four-phase clocks CK0, CK1, CK2 and CK3.

(Signal Processing Unit)

Next, description will be made on the decode unit for decoding digital data sequentially read from the column ADC units 22-1 to 22-$n$ under one of the functions of the signal processing unit 21, i.e., under control of the column scan circuit 16.

Figures 3, 4:
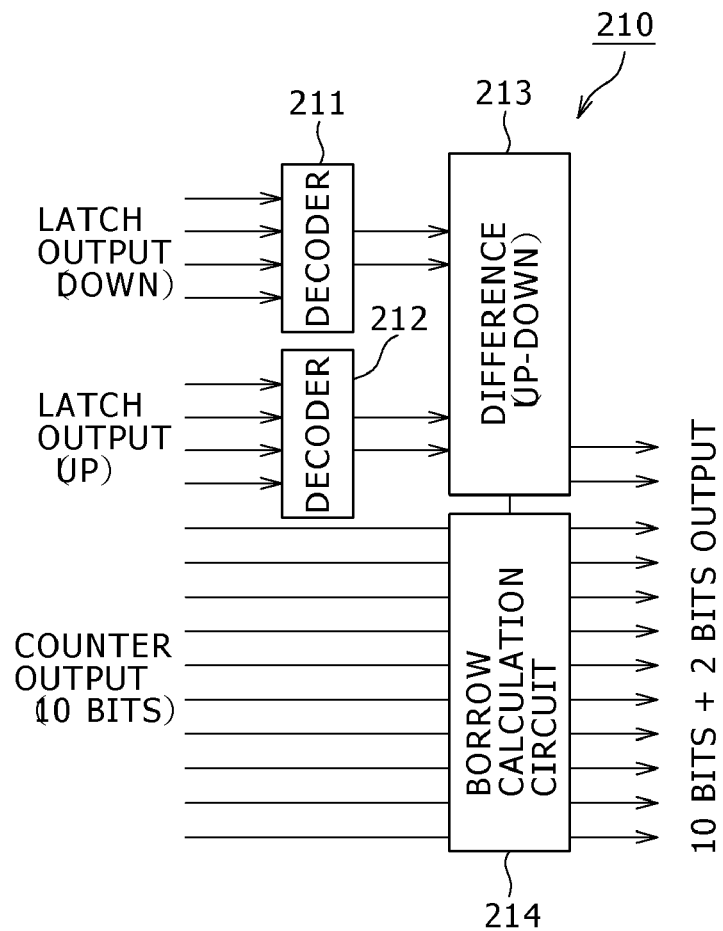
FIG. 3 is a block diagram showing an example of the structure of a decode unit of a signal processing unit.
FIG. 4 is a diagram showing a decode table of a decoder of a decode unit.

FIG. 3 is a block diagram showing an example of configuration of the decode unit of the signal processing unit 21. As shown in FIG. 3, the decode unit 210 of this example is constituted of decoders 211 and 212, a difference circuit 213 and a borrow calculation circuit 214.

The decode unit 210 decodes the latch data of the first latch unit 222 for latching the logic states of the four-phase clocks CK0, CK1, C2 and CK3 based on the high speed clock CLK and the latch data of the second latch unit 224 for latching the count value of the up/down counter 223, into a binary output extending bits lower than the lowest bit of the count value of the up/down counter 223.

The details of the latch data of the first latch unit 222 for latching the logic states of the four-phase clocks CK0, CK1, CK2 and CK3 will be described later, but the latch data is constituted of a latch output (DOWN) latched during the down count period of the up/down counter 223 and a latch output (UP) latched during the up count period.

The decoders 211 and 212 decode the latch output (DOWN) and latch output (UP) in accordance with the contents of a decode table shown in FIG. 4. Specifically, an input of four bits is Latch 3 at MSB, then Latch 2 and Latch 1, and Latch 0 at LSB (the contents of Latch 0 to Latch 3 will be later described). An input of 0001 is decoded into an output of 00 of 2 bits, 0011 into 01, 0111 into 10, 1111 into 11, 1110 into 00, 1100 into 01, 1000 into 10, and 0000 into 11.

The difference circuit 213 calculates a difference between each decode outputs of the decoders 211 and 212, i.e., difference between a decode value from the latch output (UP) and a decode value from the latch output (DOWN).

The borrow calculation circuit 214 executes a borrow calculation process for a count output (10 bits) which is a latch output of the count value of the up-down counter 223, and thereby performing a difference calculation between a decode value from the latch output (UP) added with a borrow and a decode value from the latch output (DOWN), when a decode value from latch output (DOWN) is larger than a decode value from latch output (UP).

Thus obtained difference calculation result is outputted from the signal processing unit 21 as video data of 10 bits+2 bits extending lower 2 bits from the output (10 bits) of the up/down counter 223.

[Operation of CMOS Image Sensor]

Figure 5:
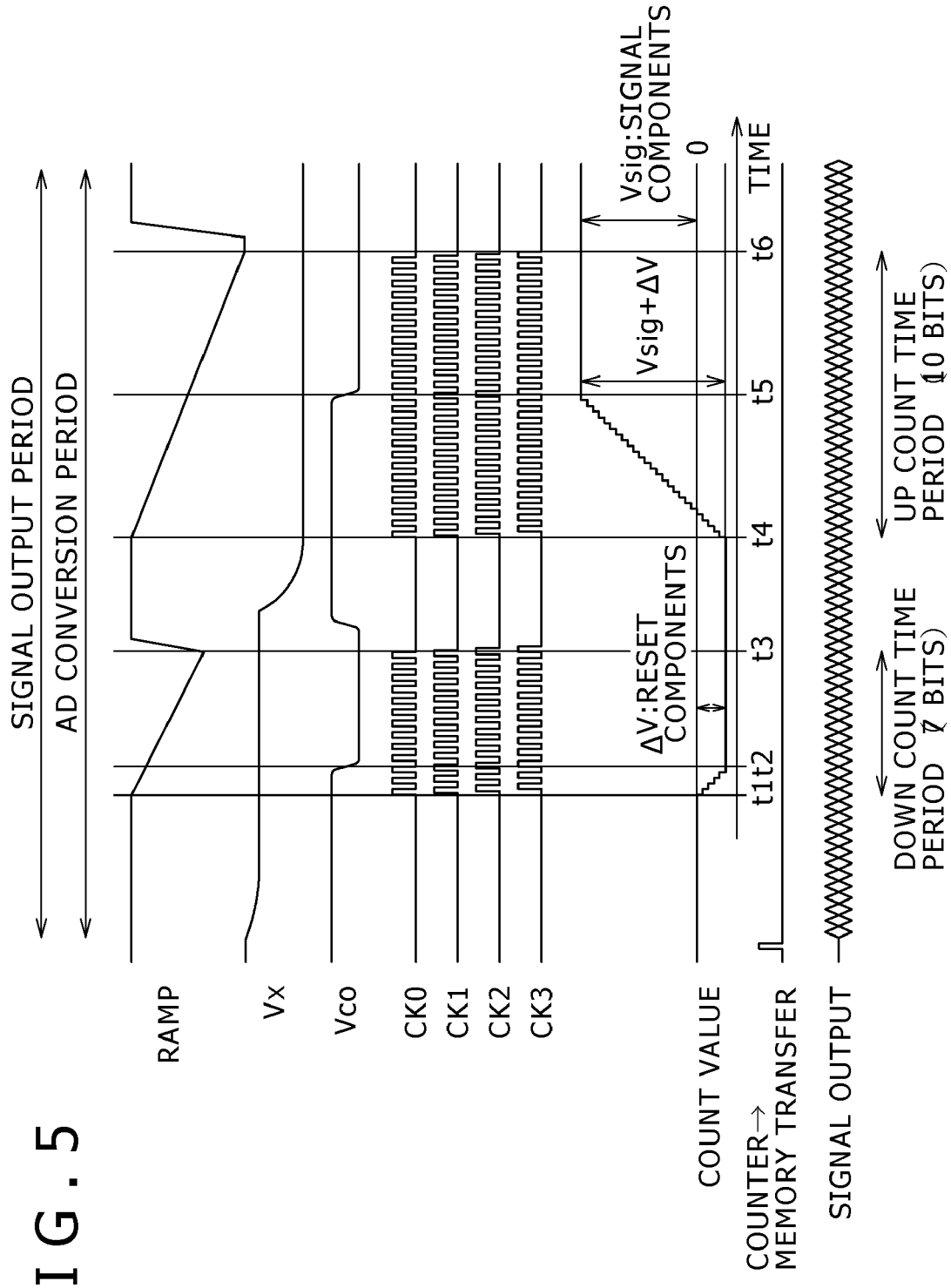
FIG. 5 is a timing chart illustrating the operation of a column ADC unit.

Next, with reference to the timing chart of FIG. 5, description will be made on the overall operation of the CMOS image sensor having the structure described above, particularly the operations of the column ADC units 22-1 to 22-n.

Although the description of the specific operation of the unit pixel 11 is omitted, a reset operation by the reset transistor and a transfer operation by the transfer transistor are performed in the unit pixel 11, as well known.

In the reset operation, a potential of the floating diffusion when reset to a predetermined potential is read from the unit pixel 11 to the column signal lines 122-1 to 122-n, as reference components (reset components). In the transfer operation, a potential of the floating diffusion when electric charges by photoelectric conversion are transferred from the photoelectric conversion element, is read from the unit pixel 11 to the column signal lines 122-1 to 122-n, as signal components.

A scheme for AD conversion in the column ADC units 22-1 to 22-n, i.e., a scheme for converting an analog pixel signal outputted from each unit pixel 11 of the pixel array 12 into a digital signal, adopts the following approach.

Namely, for example, a point where the reference voltage RAMP of the ramp waveform lowering at a predetermined slope and each voltage of the reference components and signal components of the pixel signal supplied from the unit pixel coincide is searched. A time period from when the reference voltage RAMP used for the comparison process is generated to when the reference voltage RAMP coincides with a signal corresponding to the reference components and signal components of the pixel signal, is measured by using the count by the high speed clock CLK and the logic states of the multi-phase clocks (in this example, the four-phase clocks CK0 to CK3) having a constant phase difference. In this manner, digital data corresponding to each magnitude of the reference components and signal components is obtained.

During the first read operation, reset components (reference components) ΔV containing noises of the pixel signal are read from each unit pixel 11 of the selected rows of the pixel array unit 12, as an analog pixel signal. Thereafter, during the second read operation, signal components Vsig are read. The reset components ΔV and signal components Vsig are inputted to the column ADC units 22-1 to 22-n via the column signal lines 122-1 to 122-n in time series.

The reset components ΔV read at first time contain fixed pattern noises varying per unit pixel 11 as an offset. During the second read operation, the signal components Vsig corresponding to an incident light amount per each unit pixel 11 are read, in addition to the reset components ΔV. Then, is a first AD conversion process is executed for the reset components ΔV, a second AD conversion process is executed for a signal in which the signal components Vsig is added to the reset components ΔV.

<First Read Operation>

For the first read operation, the timing control unit 19 first resets the count value of the up/down counter 223 to an initial value "0", and sets the up/down counter 223 to a down count mode.

After the first read operation from the unit pixels 11 of any pixel row to the column signal lines 122-1 to 122-n is stabilized, the timing control unit 19 supplies control data for generating a reference signal RAMP to the integrator 151 of the reference signal generate unit 15.

As the control data for generating the reference signal RAMP is supplied from the timing control unit 19, the reference signal generate unit 15 inputs the reference voltage RAMP changed in the context of time in a ramp shape as a whole, as a comparison voltage to be supplied to one input terminals of voltage comparing units 221. The voltage comparing unit 221 compares the reference voltage RAMP of a ramp waveform with an analog signal voltage Vx supplied from each unit pixel 11 of selected row of the pixel array unit 12.

At this time, while the reference voltage RAMP is inputted to the voltage comparing unit 221 (time t1), a count clock CK0 is inputted to the clock terminal of the up/down counter 223 from the delay control circuit (DLL) 201 via the first latch unit 222, in synchronization with the reference voltage RAMP generated by the reference signal generate unit 15, in order to make the up/down counter 223 disposed per column measure a comparison time of the voltage comparing unit 221.

The up/down counter 223 starts down count from the initial value "0" as a first count operation. Namely, the up/down counter 223 starts a count process in a negative direction.

The count clock CK0 is generated at the delay lock loop 201 based on the high speed clock CLK from the clock conversion unit 18, therefore, speed of the count clock is faster than speed of a master clock MCK inputted externally. Further, the count clock CK0 maintains a constant phase difference with respect to the other clocks (CK1 to C3) due to effects of the delay lock loop 201.

The voltage comparing unit 221 compares the reference voltage RAMP of the ramp shape supplied from the reference signal generate unit 15 with the signal voltage Vx inputted from the unit pixel 11 of the selected row via the column signal lines 122-1 to 122-n, and when the both voltages coincide, the comparison output Vco is inverted from the high level to the low level.

Namely, during the first read operation, the voltage comparing unit 221 compares the signal voltage corresponding to the reset components (reference components) ΔV of the unit pixel 11 with the reference voltage RAMP, outputs an active low pulse signal (comparison output Vco) after a lapse of a time corresponding to the magnitude of the reset components ΔV, and supplied the outputted signal to the first latch unit 222.

Figure 6:
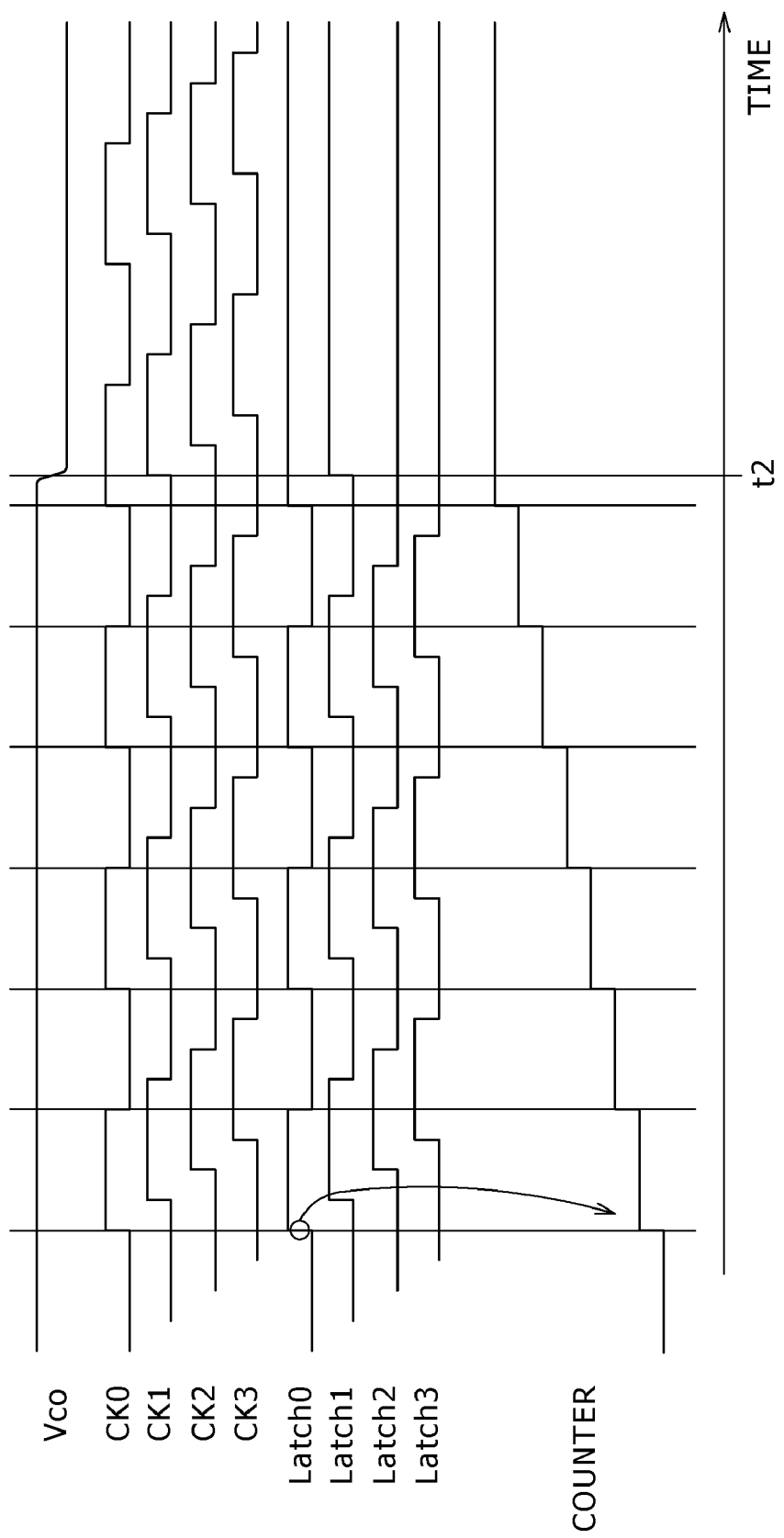
FIG. 6 is a timing chart showing as an enlarged view the timing relation before and after inversion of a comparison output Vco.

FIG. 6 is an enlarged view showing the timing relation before and after inversion of the comparison output Vco. Approximately at the same time when the active low comparison output Vco inverts, the first latch unit 222 latches the logic states (Latch 0 to Latch 3) of the four-phase clocks CK0 to CK3 supplied from the delay lock loop 201. This latch data is held in the first latch unit 222 until the latch data is read by column scan by the column scan circuit 16.

Upon receipt of the latch results of the first latch unit 222, the up/down counter 223 stops down count operation. More specifically, in the first latch unit 222, the Latch 0 becomes a state fixed to the logic "1" (high level), and since a supply of the count clock CK0 from the first latch unit 222 to the up/down counter 223 is stopped, the up/down counter 223 stops the count operation approximately at the same time when the comparison output Vco is inverted (time t2).

In other words, at the same time when the first latch unit 222 latches the logic states of the four-phase clocks CK0 to CK3 upon reception of inversion of the active low comparison output Vco, the up/down counter 223 stops the count operation. The first latch unit 222 acquires time information more detailed than the lowest bit of the count value of the up/down counter 223, as latch column information.

In the example described above, the Latch 0 becomes the state fixed to the logic "1" (high level), and a supply of the count clock CK0 is stopped, but in an actual operation, even when the Latch 0 becomes a state fixed to the logic "0" (low), a supply of the count clock CK0 is also stopped. Namely, a supply of the count clock CK0 is stopped not only when the Latch 0 takes the logic "1" but also when the Latch 0 takes the logic "0".

In this example, the clock CK0 as a count clock is supplied via the first latch unit 222 to the up/down counter 223 for measuring time, and a supply of the clock CK0 to the up/down counter 223 is stopped at the latch timing of the first latch unit 222. However, configuration in which, for example, the clock CK0 may be supplied directly from the multi-phase clock generate unit 20 to the up/down counter 223, and a supply of the clock CK0 to the up/down counter 223 may be stopped at the timing when the comparison output Vco of the voltage comparing unit 221 is inverted, may be also adoptable.

In the above-described structure, a supply of the high speed clock CLK (in this example, clock CK0) to the up/down counter 223 is performed via the first latch unit 222 which holds the logic states of the four-phase clocks CK0 to CK3 having a constant phase difference. As apparent from the above-described operation, since a supply of the clock CK0 is automatically stopped when the logic states of the four-phase clocks CK0 to CK3 are latched at the first latch unit 222, it is not necessary to provide a specific means for stopping a supply of a count clock to the counter 223, and it is advantageous in that the circuit configuration can be simplified.

In this manner, at the same time when the reference signal generate unit 15 generates the reference voltage RAMP of a ramp waveform at time t1, the up/down counter 223 starts down count. Until the active low pulse signal is obtained by a comparison process of the voltage comparing unit 221, i.e., until the comparison output Vco of the voltage comparing unit 221 is inverted, counting is performed at clock CK0 and the logic states of the four-phase clocks CK0 to CK3 having a constant phase difference and obtained by the delay lock loop 201 are latched at the timing when the comparison output Vco is inverted. It is therefore possible to obtain a bit train having a count value corresponding to the magnitude of the reset components ΔV and time information more detailed than the lowest bit of the count value.

After a lapse of a predetermined down count time period (time t3), the timing control unit 19 stops a supply of control data to the reference signal generate unit 15 and a supply of the four-phase clocks CK0 to CK3 from the multi-phase clock generate unit 20 to the first latch unit 222. Accordingly, the reference signal generate unit 15 stops generating the reference voltage RAMP of a ramp shape.

<Second Read Operation>

At the next second read operation, the signal components Vsig corresponding to an incident light amount of each unit pixel 11 are read out, in addition to the reset components ΔV, and operations similar to those at the first read operation are performed. Namely, first the timing control unit 19 sets the up/down counter 223 to an up count mode.

After the second read operation from the unit pixels 11 of any pixel row to the column signal lines 122-1 to 122-n is stabilized, the timing control unit 19 supplies control data for generating a reference signal RAMP to the integrator 151 of the reference signal generate unit 15.

As the control data for generating the reference signal RAMP is supplied from the timing control unit 19, the reference signal generate unit 15 inputs the reference voltage RAMP which is changed in context of time in a ramp shape as a whole, as a comparison voltage to be supplied to one input terminals of voltage comparing units 221. The voltage comparing unit 221 compares the reference voltage RAMP of the ramp waveform with an analog signal voltage Vx supplied from each unit pixel 11 of the selected row of the pixel array unit 12.

At the same time when the reference voltage RAMP is inputted to the voltage comparing unit 221 (time t4), a count clock CK0 is inputted to the clock terminal of the up/down counter 223 from the delay lock loop 201 via the first latch unit 222, synchronously with the reference voltage RAMP generated by the reference signal generate unit 15, in order to make the up/down counter 223 disposed per each column measure a comparison time at the voltage comparing unit 221.

The up/down counter 223 starts up count from the count value corresponding to the reset components ΔV of the unit pixel 11 obtained during the first read operation, as a second count operation, which is opposite to the first read operation. Namely, the up/down counter 223 starts a count process in a positive direction.

The voltage comparing unit 221 compares the reference voltage RAMP of the ramp shape supplied from the reference signal generate unit 15 with the signal voltage Vx inputted from the unit pixel 11 of the selected row via the column signal lines 122-1 to 122-n, and when the both voltages coincide, the comparison output Vco is inverted from the high level to the low level.

Namely, the signal voltage corresponding to the signal components Vsig is compared with the reference voltage RAMP, and an active low pulse signal (comparison output Vco) is outputted and supplied to the first latch unit 222, after a lapse of a time corresponding to the magnitude of the signal components Vsig.

Upon reception of the active low comparison output Vco, the first latch unit 222 latches (Latch 0 to Latch 3) the logic states of the four-phase clocks CK0 to CK3 supplied from the delay lock loop 201. This latch data is held in the first latch unit 222 separately from the latch data during the first read operation, until being read through column scan by the column scan circuit 16.

Upon receipt of the latch results of the first latch unit 222, the up/down counter 223 stops up count operation. More specifically, in the first latch unit 222, the Latch 0 becomes a state fixed to the logic "1" (high level), and a supply of the count clock CK0 from the first latch unit 222 to the up/down counter 223 is stopped. Therefore, the up/down counter 223 stops the count operation approximately at the same time as the comparison output Vco is inverted (time t5).

In other words, upon receipt of inversion of the active low comparison output Vco, the first latch unit 222 latches the logic states of the four-phase clocks CK0 to CK3, and at the same time, the up/down counter 223 stops the count operation.

Similar to the above-described down count operation, also at the up count operation, a supply of the count clock CK0 is stopped not only when the Latch 0 takes the logic "1" but also when the Latch 0 takes the logic "0".

As described above, at the same time when the reference voltage RAMP of a ramp waveform is generated at the reference signal generate unit 15 at time t4, the up/down counter 223 starts up count from the count value corresponding to the reset components ΔV. Until the active low pulse signal is obtained by a comparison process of the voltage comparing unit 221, i.e., until the comparison output Vco of the voltage comparing unit 221 is inverted, counting is performed at clock CK0 and the logic states of the four-phase clocks CK0 to CK3 having a constant phase difference and obtained by the delay lock loop 201 are latched at the timing when the comparison output Vco is inverted. It is therefore possible to obtain a bit train having a count value corresponding to the magnitude of the signal components Vsig and time information more detailed than the lowest bit of the count value.

After a lapse of a predetermined up count time period (time t6), a supply of control data to the reference signal generate unit 15 and a supply of the four-phase clocks CK0 to CK3 from the multi-phase clock generate unit 20 to the first latch unit 222 are stopped by the timing control unit 19. Accordingly, the reference signal generate unit 15 stops generating the reference voltage RAMP of a ramp shape.

As described above, in the CMOS image sensor 10, the reset components ΔV and signal components Vsig are inputted from each unit pixel 11 of selected row of the pixel array unit 12 to the column ADC units 22-1 to 22-n in time series via the column signal lines 122-1 to 122-n. In the CMOS image sensor 10, the up/down counter 223 performs a down count operation as a first count operation and an up count operation as a second count operation, and whereby a subtraction process of (second comparison period)−(first comparison period) is automatically performed in the up/down counter 223, and the count value corresponding to the subtraction result is held in the up/down counter 223.

(second comparison period)−(first comparison period)= (signal components Vsig+reset components ΔV+offset components of the column ADC unit 22)−(reset components ΔV+offset components of the column ADC unit 22)=signal components Vsig. Therefore, the two read operations and the subtraction process at the up/down counter 223 remove the offset components of each column ADC unit 22 (22-1 to 22-n) in addition to the reset components ΔV containing a variation per unit pixel 11. Therefore, it is possible to extract only the signal components Vsig corresponding to an incident light amount per unit pixel 11.

The process of removing the reset components ΔV containing a variation per unit pixel 11 is a so-called correlated double sampling (CDS) process. Although this CDS process is executed at the column ADC unit 22 (22-1 to 22-n) in this embodiment, it may configured that the CDS process is executed at the signal processing unit 21 at the succeeding stage. In this case, since the column ADC unit 22 (22-1 to 22-n) is not required to execute the subtraction process, a normal counter may be used in place of the up/down counter 222.

The count value held in the up/down counter 223 as the subtraction result according to the second read operations is latched by the second latch unit 224 under control of the timing control unit 19. The count values of one row latched by the second latch unit 224 are sequentially read to the horizontal output line 17 by column scan of the column scan circuit 16, and supplied to the signal processing unit 21 as pixel data of a bit train corresponding to the magnitude of the signal components Vsig.

During the read operation of pixel data corresponding to the magnitude of the signal components Vsig, the latch data during the first read operation (DOWN) and latch data during the second read operation (UP) which are latched in the first latch unit 222 by column scan by the column scan circuit 16 are sequentially read to the horizontal output line 17 and supplied to the signal processing unit 21.

Bit trains having time information more detailed than the lowest bit of the count values obtained at the first latch unit 222, i.e., respective first and second latch data, is decoded by the decoders 211 and 212 in the signal processing unit 21, and difference between the both data is obtained at the difference circuit 213.

[Operation Effects of the Embodiment]

As described so far, by generating the multi-phase clocks having a constant phase difference and by latching the logic states of the multi-phase clocks when the comparison output Vco between the signal voltage Vx of the analog pixel signal and the reference voltage RAMP of a ramp waveform is inverted, it is possible to obtain a bit train having time information more detailed than the lowest bit of the count value of the up/down counter 223 by the high speed clock CLK.

In this example, for example, the four-phase clocks CK0 to CK3 are used as the multi-phase clocks, and a time duration of one clock of the high speed clock CLK (in this example, clock CK0) can be divided into four periods. It is therefore possible to obtain a bit train having detailed time information which is a quarter unit of one clock period of the high speed clock CLK. By increasing the number of phases of the multi-phase clocks, a bit train having more detailed time information may be obtained.

By decoding the bit train having time information more detailed than the lowest bit of the count value of the up/down counter 223 at the signal processing unit 21 of the succeeding stage, the decode data can be added to the count value of the up/down counter 223 by the high speed clock CLK, as a lower bit output value. Therefore, when AD conversion is performed for the same bit width, the bit width of the up/down counter 223 may be reduced.

Accordingly, AD conversion faster than correspondence of reduction of the bit width of the up/down counter 223 becomes possible without being limited by the operation speed of the up/down counter 223. If AD conversion is performed in the same AD conversion time, the bit width of AD conversion may be widened.

[Modifications]

In the embodiments, descriptions are made by citing examples in which the present invention is applied to a CMOS image sensor having unit pixels disposed in a matrix shape and detecting signal charges of a charge amount corresponding to a visual light amount as a physical quantity. However, the present invention is not limited to application to the CMOS image sensor, but applicable to general solid state image capture devices of the column (column parallel) AD conversion scheme having ADC units disposed in correspondence to pixel columns of the pixel array unit.

Further, application of the present invention is not limited to the solid state image capture device for capturing an image by detecting a distribution of a visual light incidence amount, but applicable to a solid state image capture device for capturing a distribution of an incidence amount of infrared light, X-rays, particles or the like as images, and in broad meaning, to general solid state image capture devices (physical quantity distribution detect devices) such as a finger print detect sensor, for detecting and capturing a distribution of other physical quantities such as pressure and electrostatic capacitance, as images.

Furthermore, application of the present invention is not limited to a solid state image capture device for reading a pixel signal from each unit pixel by sequentially scanning each unit pixel of the pixel array unit by the row unit basis, but also to a solid state image capture device of an X-Y address type for selecting an arbitrary pixel on the pixel unit basis and reading a signal from the selected pixel on the pixel unit basis.

The solid state image capture device may be in the form of a one chip, or in the form of a module having an image capture function and collectively packaging the imaging unit and the signal processing unit or optical system.

Further, application of the present invention is not limited to the solid state image capture device, but also to an image capture apparatus. The image capture apparatus described here is intended to mean a camera system, such as a digital still camera and a video camera, and an electronic apparatus having an imaging function, such as a mobile phone. The form of the module mounted on an electronic apparatus, i.e., a camera module, may be used as the image capture apparatus.

[Image Capture Apparatus]

Figure 7:
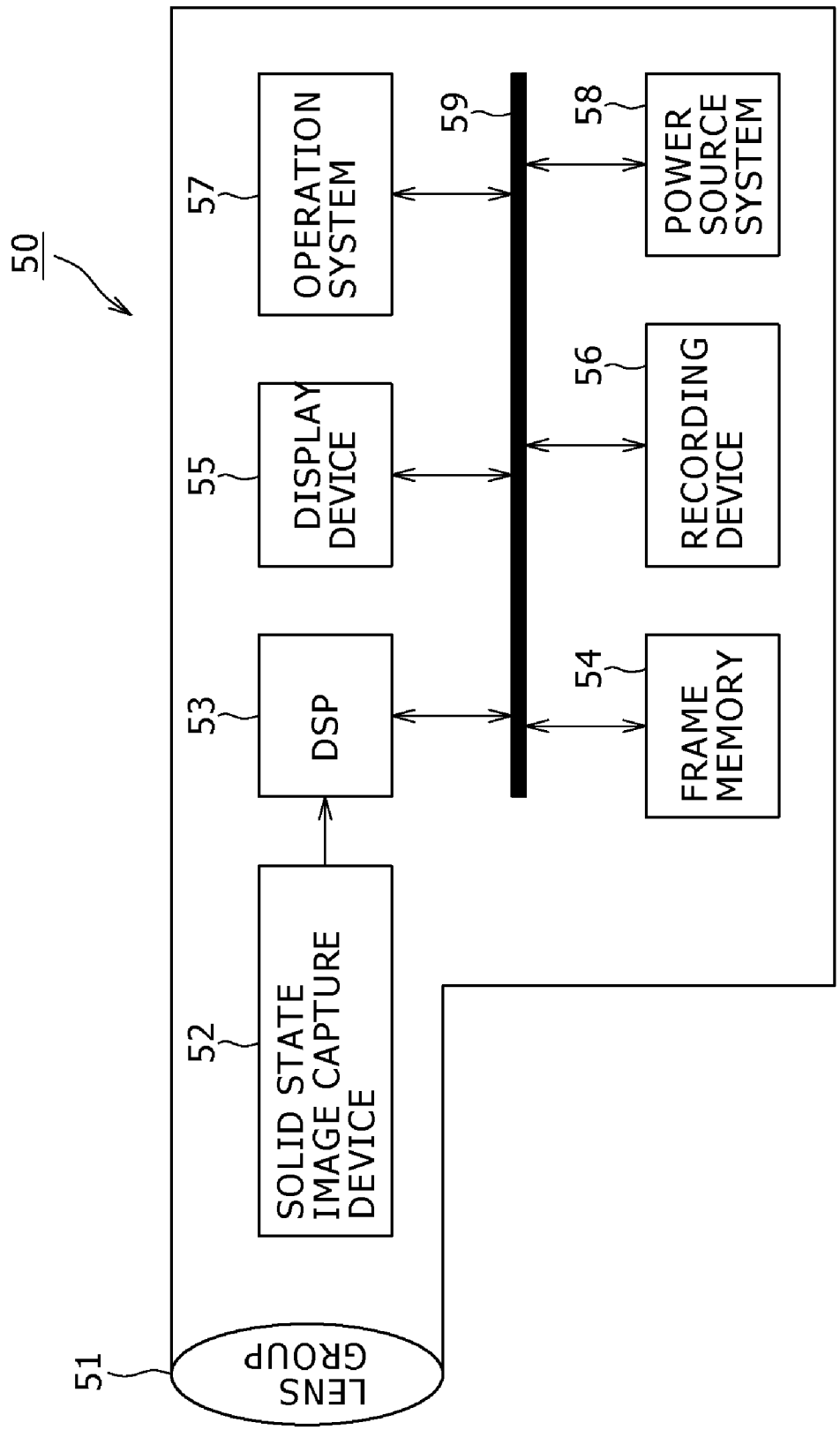
FIG. 7 is a block diagram showing an example of the structure of an image capture apparatus of the present invention.

FIG. 7 is a block diagram showing an example of the structure of an image capture apparatus according to the present invention. As shown in FIG. 7, the image capture apparatus 50 according to the present invention includes an optical system having a lens group 51, a solid state image capture device 52, a DSP circuit 53 as a camera signal processing circuit, a frame memory 54, a display device 55, a recording device 56, an operation system 57, a power source system 58 and the like, and configured such that the DSP circuit 53, frame memory 54, display device 55, recording device 56, operation system 57 and power source system 58 are interconnected via a bus line 59.

The lens group 51 takes in incident light (image light) from an object and forms an image on an imaging plane of the solid state image capture device 52. The solid state image capture device 52 converts a light amount of the incident light formed as image on the imaging plane by the lens group 51 into an electric signal by the pixel unit basis, and outputs the electric signal as a pixel signal. As the solid state image capture device 52, the CMOS image sensor 10 of the column AD conversion scheme of the above-described embodiment is used.

The display device 55 is constituted of a panel type display unit, such as a liquid crystal display unit and an organic electro luminescence (EL) display unit, and displays moving images or still images captured by the solid state image capture device 52. The recording device 56 records moving images or still images captured by the solid state image capture device 52 to a recording medium, such as a video tape and a digital versatile disk (DVD).

The operation system 57 issues an operation command for various functions of the image capture apparatus based on a user operation. The power supply system 58 supplies various power supply which functions as operation powers to the target devices including the DSP circuit 53, frame memory 54, display device 55, recording device 56 and operation system 57.

As described above, the CMOS Image sensor 10 of the column AD conversion scheme according to the above-described embodiment is used as the solid state image capture device 52 at the image capture apparatus, such as a video camera, a digital still camera, a camera module for mobile apparatus such as a mobile phone. Accordingly, since a faster AD conversion process can be realized by the CMOS image sensor 10, a processing speed as the image capture apparatus may be made faster.

It should be understood by those skilled in the art that various modifications, combinations, sub-combinations and alterations may occur depending on design requirements and other factors insofar as they are within the scope of the appended claims or the equivalents thereof.

The present document contains subject matter related to Japanese Patent Application No. 2007-203786 filed in the Japanese Patent Office on Aug. 6, 2007, the entire content of which being incorporated herein by reference.

What is claimed is:

1. A solid state image capture device comprising:
   a pixel array unit having unit pixels including a photoelectric conversion element disposed in a matrix shape; and
   analog/digital conversion means for converting an analog pixel signal read from the unit pixel of the pixel array unit into digital data, wherein;
   the analog/digital conversion means includes;
   a comparator unit for converting a magnitude of the pixel signal into information in a time axis direction by comparing a reference signal for converting into the digital data with the analog pixel signal;
   a counter unit for performing a count process during a time period from a start time of a comparison process at the comparator unit to an end time of the comparison process, based on a predetermined clock;
   a multi-phase clock generate unit for generating multi-phase clocks having a constant phase difference based on the predetermined clock;
   a latch unit for latching logic states of the multi-phase clocks when the comparison process at the comparator unit is completed; and
   a decode unit for decoding latch data of the latch unit to obtain a value lower than a count value by the count process.

2. The solid state image capture device according to claim 1, wherein;
   the pixel signal includes reference components and signal components;
   the comparator unit performs a first comparison process of comparing a signal corresponding to the reference components with the reference signal and a second comparison process of comparing a signal corresponding to the signal components with the reference signal; and
   the counter unit performs a down count or up count process during a time period from a start time to an end time of the first comparison process, and performs an up count or down count process during a time period from a start time to an end time of the second comparison process.

3. The solid state image capture device according to claim 2, wherein;
   the latch unit holds first logic states of the multi-phase clocks when the first comparison process is completed at the comparator unit and second logic states of the multi-phase clocks when the second comparison process is completed at the comparator unit.

4. The solid state image capture device according to claim 3, further comprising:
   a calculation unit for calculating a difference between latch data of the first logic states of the latch unit and latch data of the second logic states of the latch unit.

5. The solid state image capture device according to claim 1, wherein;
   the latch unit supplies one of the multi-phase clocks supplied from the multi-phase clock generate unit to the counter unit as the count clock.

6. An analog/digital conversion method for a solid state image capture device, wherein;
   in converting an analog pixel signal read from a unit pixel of a pixel array unit having unit pixels each including a photoelectric conversion element disposed in a matrix shape, into digital data, the analog/digital conversion method comprising the steps of:
   converting a magnitude of the pixel signal into information in a time axis direction by comparing a reference signal for conversion into the digital data with the analog pixel signal;
   performing a count process during a time period from a start time to an end time of the comparison process, in accordance with a predetermined clock; and
   latching logic states of multi-phase clocks having a constant phase difference and generated in accordance with the predetermined clock when the comparison process is completed, and decoding the latch data to obtain a value lower than a count value by the count process.

7. An image capture device comprising:

a solid state image capture device including a pixel array unit having unit pixels each including a photoelectric conversion element disposed in a matrix shape, and analog/digital conversion means for converting an analog pixel signal read from the unit pixel of the pixel array unit into digital data; and an optical system for forming an image from incident light on an imaging plane of the solid state image capture device, wherein;

the analog/digital conversion means includes;

a comparator unit for converting a magnitude of the pixel signal into information in a time axis direction by comparing a reference signal for conversion into the digital data with the analog pixel signal;

a counter unit for executing a count process during a time period from a start time of a comparison process at the comparator unit to an end time of the comparison process, based on a predetermined clock;

a multi-phase clock generate unit for generating multi-phase clocks having a constant phase difference based on the predetermined clock;

a latch unit for latching logic states of the multi-phase clocks when the comparison process at the comparator unit is completed; and a decode unit for decoding latch data of the latch unit to obtain a value lower than a count value by the count process.

* * * * *